United States Patent
Buchoff et al.

[11] 3,992,073
[45] Nov. 16, 1976

[54] MULTI-CONDUCTOR PROBE

[75] Inventors: Leonard S. Buchoff, Bloomfield; Chris A. Dalamangas, Union, both of N.J.

[73] Assignee: Technical Wire Products, Inc., Cranford, N.J.

[22] Filed: Nov. 24, 1975

[21] Appl. No.: 634,529

[52] U.S. Cl. .......................... 339/108 TP; 324/72.5
[51] Int. Cl.² ......................................... H01R 13/00
[58] Field of Search .......................... 324/72.5, 158; 339/108 TP, 108 R

[56] References Cited
UNITED STATES PATENTS

| | | | |
|---|---|---|---|
| 2,885,648 | 5/1959 | King | 339/108 TP |
| 3,609,539 | 9/1971 | Gunthert | 324/72.5 |

OTHER PUBLICATIONS
IBM Technical Bulletin, 7–1971, Murcko, "Split—Tip Probe".
Western Electric, 7–1972, Furber, "Two Conductor Probe".

*Primary Examiner*—Roy Lake
*Assistant Examiner*—DeWalden W. Jones
*Attorney, Agent, or Firm*—Littlepage, Quaintance, Murphy & Dobyns

[57] ABSTRACT

A multi-conductor probe, having a probe end adapted to contact a body to be probed, consists of a first element of electrically insulative elastomer and a plurality of elements of electrically conductive elastomer contiguously bonded to the first element such that each of the electrically conductive elements is insulated from any other of the electrically conductive elements. Each of the electrically conductive elements is electrically connectable to an external electrical test means at a point remote from the probe end. The electrically insulative element and the electrically conductive elements are substantially coterminous at the probe end.

20 Claims, 5 Drawing Figures

MULTI-CONDUCTOR PROBE

BACKGROUND OF THE INVENTION

1. Field of the Invention

This invention relates to electrical contact structures having electrically conductive probing members such as fingers, needles, or the like, that make electrical contact with an item to be probed. More specifically, the invention relates to electrical probes for use in measuring and testing electronic devices with a multiplicity of contact elements or points. The invention has particular utility as a Kelvin probe, that is, a probe adapted for sensing two or more electrical parameters present at a single point in the electrical circuit of the device or body to be probed.

2. Description of the Prior Art

The testing of the electrical parameters of fragile, miniature semi-conductor devices such as tunnel diodes, transistors, integrated circuits, and the like, requires the use of very delicate and reliable equipment which will not damage the device being tested. The substrates of these devices which are contacted by a probe during the testing are typically ¼ to ½ mil thick, have lengths and widths of 25 mils, may have ball terminals which are 20 mils in diameter and spaced 15 mils apart. It is therefore necessary that any probe have compatable dimensions in order to unambiguously sense the particular electrical parameter desired at the particular point in the electrical circuit selected. The use of Kelvin probes has become standard in the industry in order to substantially eliminate any error in the sensed parameter due to contact resistance and lateral spacing between probe ends. A typical Kelvin probe together with a discussion of the technique used in testing the electrical parameters of a device with a Kelvin probe is to be found in U.S. Pat. No. 3,609,539.

Since the contact areas on the electrical devices to be probed are of such small dimensions and typically fragile, it is necessary that the probe come in contact with the contact areas in such a manner as will not damage or destroy the device to be probed. Any cracking or breaking of a contact area or ball terminal may destroy the device as well as give erroneous readings of the electrical behavior of the device. Particular difficulty has been experienced with lateral components of forces exerted by probe of the test equipment making engagement with the contact areas and ball terminals, leading to gouging of substrate surfaces and shearing off the ball terminal. It is necessary, however, that sufficient force be applied between the probe and the contact area to assure a good electrical connection, yet still without damaging the device.

Previous attempts at solving this problem have centered on designing Kelvin probes having a self-centering feature such as is found in U.S. Pat. No. 3,609,539. The Kelvin probes are then typically received in gimbaled mountings which permit motion of the probe so as to prevent the contact and shearing forces from becoming unacceptably large. An example of such a mounting is discussed in *IBM Technical Disclosure Bulletin*, Vol. 7, No. 6, November 1964, pages 444–445. While the gimbaled mountings of the Kelvin probes together with the use of self-centering features has met with some success, damage to the device to be probed continues to occur with such frequency as to require the development of yet further improvements which would reduce the possibility of damage to the device.

Another example of a Kelvin probe is to be found in *IBM Technical Disclosure Bulletin*, Vol. 13, No. 11, April 1971, page 3365.

SUMMARY OF THE INVENTION

A multi-conductor probe, having a probe end adapted to contact an electrical device to be probed, has a first element of electrically insulated elastomer and a plurality of elements of electrically conductive elastomer contiguously bonded to the first element such that each of plurality of elements is electrically insulated from any other of the plurality of elements. Each of the plurality of elements is electrically connectable to an appropriate external electrical test means at a point remote from the probe end. The first element and the plurality of elements are substantially coterminous at the probe end. The multiconductor probe can also have a plurality of electrically conductive metal ribbons, each ribbon being electrically connected to one of the plurality of elements at a point removed from the probe end. The probe can further have an appropriate means for maintaining the plurality of ribbons in electrical contact with the plurality of elements.

In one embodiment of the invention, the probe has a first element of electrically insulative elastomer and two elements of electrically conductive elastomer contiguously bonded to the first element such that the first element is sandwiched between the two elements. The first element of electrically insulative elastomer insulates the two elements of electrically conductive elastomer from one another. All three elements are substantially coterminous at the probe end. The probe further has connecting means for electrically connecting the two elements of electrically conductive elastomer to an appropriate external electrical test means at a point remote from the probe end.

The resilient character of the elastomers involved insures a good electrical connection between the probe and the contact area or ball terminal of the device since the probe elastically deforms in response to external forces experienced when the probe touches the device to be probed. This effects vibrational absorbing and cushioning not available from solid metal probes even when supported by a gimbal-mounted support. This damped flexible absorbing and cushioning effected by the elastic deformation of the probe end eliminates the gouging and shearing action exhibited by conventional metal probes and also tends to hermetically seal that portion of the contact area covered by the probe end thereby inhibiting any formation of surface corrosion during the electrical testing process. The elastomers should have a durometer of less than 85 Shore A and preferably between 25 and 65 Shore A. The advantages of using elastomers for probe tips has been recognized previously to a limited extent by U.S. Pat. No. 3,832,632.

The elastomers forming the elements of a multi-conductor probe according to this invention should also exhibit the frictional characteristics which would reduce or prevent any sliding of a probe end with respect to the contact area of the device being probed. An elastomer should exhibit a static coefficient of friction between the elastomer and the body to be probed of more than 0.6 and preferably of more than 1.0. A satisfactorily high coefficient of friction will prevent the probe end from sliding and gouging the contact area of the device to be probed.

Elastomers which can be satisfactorily used include copolymers of butadiene-styrene, butadiene-acrylonitrile, and butadiene-isobutylene as well as chloroprene polymers, polysulfide polymers, plasticized polyvinyl chloride and polyvinyl acetate, polyurethanes and silicone rubbers having the previously discussed physical properties. The silicone rubbers conventionally are dimethyl, methyl-phenyl, methyl-vinyl, or the halogenated siloxanes that are mixed with fillers such as a silica to impart proper rheology and vulcanized or cured with peroxides or metal salts. Silicone rubber is generally preferred because of its aging characteristics and its retention of physical characteristics at temperature extremes. Greater integrity (i.e., unitary nature) of the multi-conductor probe of this invention can be assured by using the same elastomeric material for both the conductive and non-conductive layers, the differences in conductivity resulting only from the choice of appropriate fillers.

A non-conductive elastomer is an elastomer having a volume resistivity equal to or greater than $10^8$ Ohm-cm. Silicone elastmers, in the absence of conductive fillers, typically have a volume resistivity of $10^{14}$ to $10^{15}$ Ohm-cm and a dielectric strength of about 500 volts per mil in a ⅛th inch thick sample. Examples of non-conductive silicone elastomers are General Electric Company RTV-615 and Rodhelm-Reiss compound 4859.

While the resistivity of conductive elastomer can be varied over wide ranges, typically $10^{-4}$ OHM-cm. to $10^4$ Ohm-cm, low resistivity values are generally preferred to reduce problems such as capacitive interference which can be experienced at the higher resistivity values.

Conductive elastomers having higher values of resistivity, $10^0$ to $10^4$ Ohm-cm., are generally created by using a carbon-filled elastomer. An example of a carbon-filled conductive elastomer is Union Carbide silicone compound K-1516.

Conductive elastomers having lower values of resistivity, $10^{-4}$ Ohm-cm. to $10^0$ Ohm-cm., are created by incorporating into the elastomer conductive fillers such as copper, nickel and silver, and metal-coated fillers such as silver-coated copper and silver-coated glass. The metal-filled elastomers may also contain carbon to improve the physical characteristics of compression set and strength. An example of a metal-filled conductive elastomer is found in Table 1.

TABLE 1

| Material | Weight |
|---|---|
| Silicone rubber compound methyl phenyl vinyl siloxane gum (General Electric, SE-5211U) | 13.0 % |
| 2,5-bis (tert-butylperoxy)-2,5-dimethyl-hexane carried on inert carrier, 50 % active (R. T. Vanderbilt Co., VAROX) | 0.1 % |
| Dicumyl peroxide carried on carrier of precipitated calcium carbonate, 40 % active (Hercules, Inc., Di-Cup 40C) | 0.1 % |
| Silver powder Average particle diameter, 0.6–3.0 microns Apparent density, 8–16 gms/in$^3$ (Handy & Harmon, SILPOWDER 130) | 63.8 % |
| Silver powder Average particle diameter 3.0–4.0 microns Apparent density 16–19 gms/in$^3$ (Metz Metallurgical Corp., EG-200) | 11.5 % |
| Silver flake Average particle diameter 10.0 microns Average particle thickness 1.5 microns Apparent density 20–27 gms/in$^3$ (Metz Metallurgical Corp., Ag Flake No. 6) | 11.5 % |

An elastomeric multi-conductor probe according to this invention can easily be made by first forming an elongated element of non-conductive or insulative elastomer. A plurality of longitudinal elements of electrically conductive elastomer are then formed and arranged in substantially parallel arrangement around the first element, sufficient space being maintained between each of the elements of conductive elastomer to assure electrical independence. The conductive elements are then bonded to the first element and one end trimmed so that all the elements are coterminous and present and substantially monolithic surface. If the elastomers selected to make the elements of such a probe are the same except for the choice of appropriate fillers to effect differences in conductivity, the electrically insulative element will typically be softer than the conductive element thereby permitting a natural pocketing action when the probe end comes in contact with a ball terminal on a device to be probed. The multi-conductor probe thus made can then be placed in an appropriate holder and connected to appropriate external electrical test means at a point remote from the probe end.

A particularly advantageous method of making a two-conductor elastomeric probe according to this invention is to first cast or mold a thin layer of an electrically conductive elastomer. A thin layer of electrically non-conductive or insulative elastomer is then cast or molded on top of the first layer. A final third layer of electrically conductive elastomer is then cast on the top of the first two layers, all three layers then being post cured bonding the three layers together thereby forming a layered unitary mass having a central portion which is non-conductive and two peripheral portions, insulated from each other, which are electrically conductive. One edge of the layered unitary mass is then trimmed in a straight line. The layered mass is then sliced at right angles to the trimmed edge, thereby forming a plurality of individually existing segments, each segment having a first element of electrically insulative elastomer sandwiched between two elements of electrically conductive elastomer. A segment thus made is then combined with an appropriate connecting means for electrically conducting it to an appropriate external electrical test means. The end of the segment which was previously part of the trimmed edge can function as the probe end.

In one particular embodiment, a segment as previously formed can then be combined with two metal ribbons, each ribbon having one side in contact with a portion of one of the two electrically conductive portions of the probe remote from the probe end. The two metal ribbons are held in electrically conducting relationship with the two elements of electrically conductive elastomer by surrounding them with a section of heat-shrinkable tubing and shrinking the tubing once it is appropriately positioned.

In another embodiment, two strips of metal foil are vulcanized to a previously formed segment, each strip of metal foil having one side in contact with a portion of one of the two electrically conductive portions of the probe remote from the probe end. A section of heat-shrinkable tubing is then appropriately positioned and shrunk to immobilize the strips and prevent them from being peeled from the surface of the segment.

An advantage in production can be realized by attaching continuous strips of metal foil to the layered unitary mass before the mass is sliced into segments.

The slicing of the mass into segments then also slices the continuous strips of foil into foil ribbons of the correct dimension thereby eliminating the individual manipulation of each tiny segment to attach the ribbon leads. The continuous strips of metal foil can be attached with the aid of a conductive adhesive or directly vulcanized to the layered unitary mass.

These and other features and advantages of the invention will become apparent from the following more particular description and accompanying drawings.

DESCRIPTION OF PREFERRED EMBODIMENTS

Figure 1:
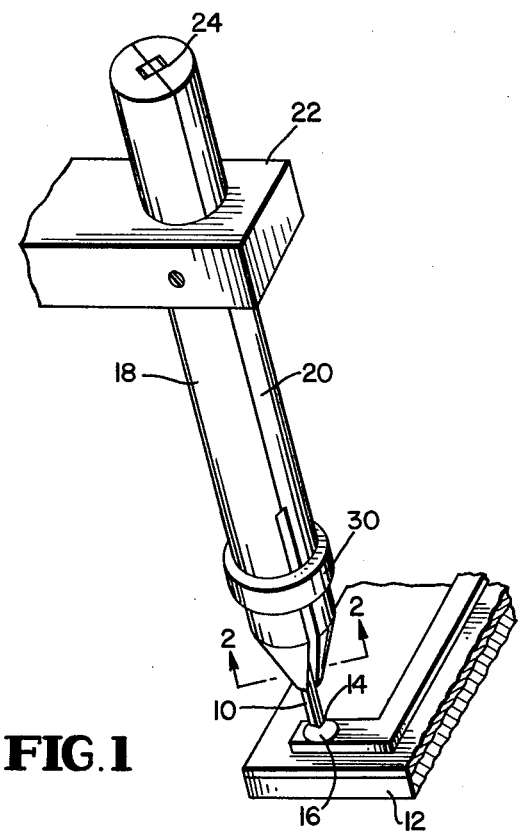
FIG. 1 is a perspective view of an elastomeric multi-conductor probe according to this invention retained in a holder means, the probe end being in contact with a body to be probed.

A multi-conductor probe 10 according to this invention is illustrated in FIG. 1 contacting a body 12 to be probed by a probe end 14 touching a ball terminal 16. The probe 10 is retained in an appropriate holder means 18 illustrated having a bifurcated body 20 adapted to receive and hold the probe 10. The holder means 18 is supported by a support 22 of conventional design. The holder means 18 includes means 24 for electrically connecting the probe to appropriate external test means (not shown) at a point remote from the probe end.

Figure 2:
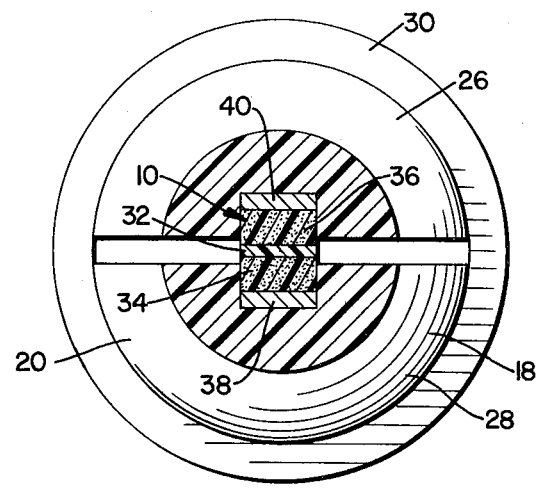
FIG. 2 is a sectional view of the multi-conductor probe and holder means shown in FIG. 1 cut along line 2—2.

The multi-conductor probe 10 and holder means 18 are illustrated more fully in an enlarged view, partially in section, in FIG. 2. The holder means 18 includes two portions 26 and 28 of the bifurcated body 20. The two sections 26 and 28 retain the probe 10 by means of a retaining ring 30 surrounding the bifurcated body 20.

The probe 10 as illustrated in FIG. 2 comprises a first element 32 of electrically insulative elastomer. Two elements 34 and 36 of electrically conductive elastomer are bonded to the first element 32 such that the first element 32 is sandwiched between the two elements 34 and 36. Further, the two elements 34 and 36 are electrically insulated from one another by the first element 32. The connecting means 24 for electrically connecting the two elements 34 and 36 to an external electrical test means (not shown) consists of two metal ribbons 38 and 40, each ribbon having one side in electrically conducting contact with a portion of one of the two elements 34 and 36.

Figure 3:
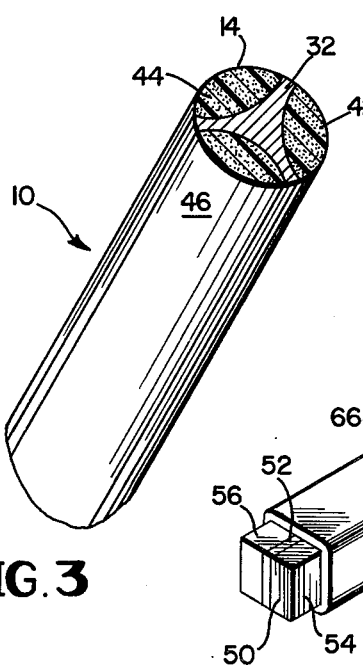
FIG. 3 is a perspective view partially in section of another embodiment of a multi-conductor probe according to this invention.

In FIG. 3, yet another embodiment of a multi-conductor probe 10 according to this invention is illustrated. The probe has a probe end 14 adapted to contact a body to be probed. The multi-conductor probe 10 comprises a first element 32 of electrically insulative elastomer and a plurality of elements 42, 44, and 46 of electrically conductive elastomer contiguous with and bonded to the first element 32 such that each of the plurality of elements 42, 44 and 46 is electrically insulated from any other of the plurality of elements. Each of the plurality of elements 42, 44 and 46 is electrically connectable to an external electrical test means (not shown) at a point remote from the probe end 14. The first element 32 and the plurality of elements 42, 44 and 46 are substantially coterminous at the probe end 14.

Figure 4:
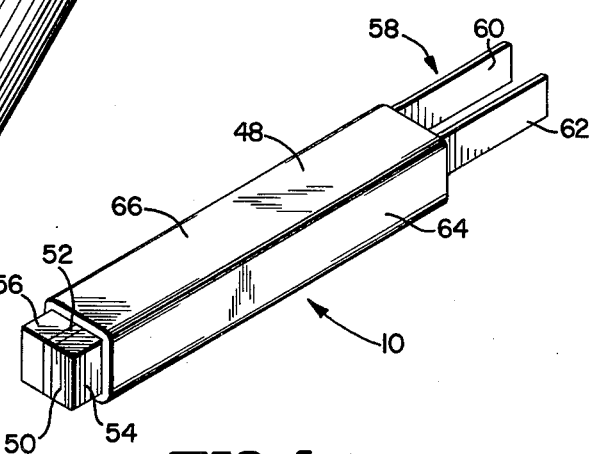
FIG. 4 is a perspective view of yet another embodiment of a multi-conductor probe according to this invention.
Figure 5:
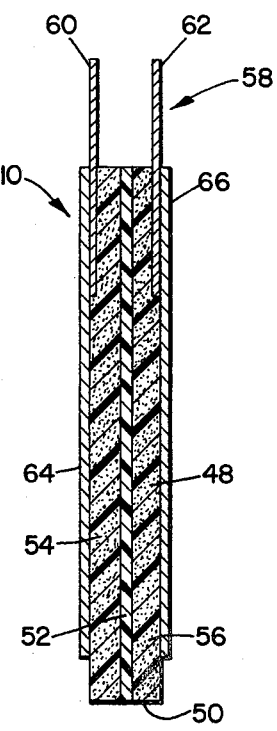
FIG. 5 is a sectional view of the probe illustrated in FIG. 4.

Yet another embodiment of the probe 10 is illustrated in FIGS. 4 and 5. A two-conductor Kelvin probe 48 has a probe end 50 adapted to contact a body to be probed. The probe 48 comprises a first element of electrically insulative elastomer 52 sandwiched between two elements 54 and 56 of electrically conductive elastomer. The two elements 54 and 56 are electrically insulated from one another by the first element 52. The first element 52 and the two electrically conductive elements 54 and 56 are substantially coterminous at the probe end 50. A connecting means 58 for electrically connecting the two elements 54 and 56 to an external electrical test means (not shown) at a point remote from the probe end comprises two metal ribbons 60 and 62. The two metal ribbons 60 and 62 are attached to the two elements 54 and 56 respectively by means of a conductive adhesive or direct vulcanization. A holder means 64 surrounding the two elements 54 and 56 and said connecting means 58 maintains the connecting means 58 in electrical contact with the two elements 54 and 56. The holder means 64 is a section of heat-shrinkable tubing 66 appropriately positioned and shrunk to contiguously surround a major portion of the two elements 54 and 56 and the connecting means 58 while leaving the probe end 50 exposed to permit the probe 50 to come in contact with a body to be probed.

Although the invention has been described in considerable detail with reference to certain preferred embodiments thereof, it will be understood that the variations and modifications can be effected within the spirit and scope of the invention as described above and as defined in the appended claims.

What is claimed is:

1. The multi-conductor probe having a probe end adapted to contact a body to be probed comprising
a first element of electrically insulative elastomer and
a plurality of elements of electrically conductive elastomer contiguous with and bonded to the first element such that each of said plurality of elements is electrically insulated from any other of said plurality of elements, each of said plurality of elements being electrically connectable to external electrical test means at a point remote from the probe end, the first element and said plurality of elements being substantially coterminous at the probe end.

2. The multi-conductor probe of claim 1 further comprising a plurality of electrically conductive metal ribbons, each ribbon electrically connected to one of said plurality of elements at a point removed from the probe end.

3. The multi-conductor probe of claim 2 further comprising means surrounding the plurality of electrically conductive metal ribbons and the plurality of elements for maintaining the plurality of ribbons in electrical contact with the plurality of elements.

4. The multi-conductor probe of claim 1 wherein the elastomers of said first element and said plurality of elements have a durometer less than 85 Shore A.

5. The multi-conductor probe of claim 1 wherein the elastomers of said first element and said plurality of elements exhibit a static coefficient of friction between the elastomers and the body to be probed of more than 0.6.

6. The multi-conductor probe of claim 1 wherein said plurality of elements of the electrically conductive elastomer consists of two elements, said first element sandwiched between the two elements.

7. The multi-conductor probe of claim 6 further comprising two metal ribbons, each ribbon having one side in contact with a portion of one of said two elements remote from the probe end.

8. The multi-conductor probe of claim 7 further comprising a section of heat-shrinkable tubing contiguously surrounding said two metal ribbons, said two elements and said first element for maintaining said two metal ribbons in electrically conducting relationship with said two elements.

9. The multi-conductor probe of claim 6 wherein the elastomers of said first element and said two elements have a durometer of less than 65 Shore A.

10. The multi-conductor probe of claim 6 wherein the elastomers of said first element and said two elements exhibit a static coefficient of friction between the elastomers and the body to be probed of greater than 1.0.

11. A two conductor Kelvin probe having a probe end adapted to contact a body to be probed comprising
a first element of electrically insulative elastomer,
two elements of electrically conductive elastomer contiguous with and bonded to the first element such that said first element is sandwiched between said two elements and such that each of said two elements is electrically insulated from the other by said first element, the first element and said two elements being substantially coterminous at the probe end, and
correcting means for electrically connecting said two elements to an external electrical test means at a point remote from the probe end.

12. The probe of claim 11 wherein the elastomers of said first element and said two elements have a durometer less than 85 Shore A and exhibit a static coefficient of friction between the elastomers and the body to be probed of more than 0.6.

13. The probe of claim 12 wherein the first element is formed of an elastomer having a bulk resistivity greater than $10^8$ Ohm-cm.

14. The probe of claim 12 wherein said two elements are formed of an elastomer having a bulk resistivity of between $10^{-4}$ Ohm-cm. and $10^4$ Ohm-cm.

15. The probe of claim 11 wherein said first element is softer than said two elements thereby permitting a natural pocketing action when the probe end comes in contact with a body to be probed.

16. The probe of claim 11 further comprising holder means surrounding said two elements and said connecting means for maintaining the connecting means in electrical contact with the two elements.

17. The probe of claim 16 wherein said holder means is a section of heat-shrinkable tubing contiguously surrounding said two elements.

18. The probe of claim 16 wherein said holder means is a bifurcated body adapted to receive and hold said two elements and said first element.

19. The probe of claim 11 wherein the elastomers are Silicone rubbers.

20. A two conductor Kelvin probe having a probe end adapted to contact a body to be probed comprising
a first element of electrically insulative elastomer and two elements of electrically conductive elastomer contiguous with and bonded to the first element such that said first element is sandwiched between said two elements thereby forming a layered unitary mass comprising a central portion which is electrically non-conductive and two peripheral portions, insulated from each other, which are electrically conductive, the layered unitary mass terminating at a probe end,
connecting means for electrically connecting said two elements to an external electrical test means at a point remote from the probe end comprising a pair of foil ribbons, one each vulcanized to a peripheral portion of the layered unitary mass, and
holder means surrounding said layered unitary mass and said connecting means for maintaining the connecting means in electrical contact with the peripheral portions of the layered unitary mass, the holder means comprising a section of heat-shrinkable tubing contiguously surrounding the layered unitary mass.

* * * * *